April 7, 1959

S. L. YARBROUGH 2,881,405

MOUNTING APPARATUS

Filed March 7, 1956

INVENTOR.
STANTON L. YARBROUGH

BY Carl H. Synnestvedt

AGENT 2,881,405

MOUNTING APPARATUS

Stanton L. Yarbrough, Glenside, Pa., assignor to Philco Corporation, Philadelphia, Pa., a corporation of Pennsylvania Application March 7, 1956, Serial No. 570,025

3 Claims. (Cl. 339—17)

This invention relates to the assembly of electrical components, and more particularly to apparatus useful in securing components, along with their associated wire leads, to panel-carried conductive strips which may advantageously, although not necessarily, be of the so-called "printed" type.

In this art it is frequently the practice to attach components to panels, through the agency of the component lead wires. In attaching a component by this method its lead wires are first inserted through apertures that pierce both the insulating panel and the conductive strips which define the circuit. The wires are then cut to desired lengths and bent toward the printed circuit carried by the panel. Following this operation, and in order permanently to attach the component, the lead wires are soldered, by known means, to the printed wiring. It has bcome increasingly advantageous to perform the necessary manipulation of components, in fulfillment of the foregoing operations and in the interests of mass production, by mechanical devices. However there have evolved certain electronic components of such small size that it has become increasingly difficult to assemble the same into the desired printed wire circuitry, particularly when assembly is performed by automatic machinery of known design. For example, the wire leads of certain components have diameters of the order of .016 inch, and because of the flexibility of such small diameter wire, utilization of automatic machinery for insertion of component lead wires has presented substantial difficulties. Furthermore, in the course of insertion, small wire leads of the type described, may not ensure substantially rigid mounting of the component, during the ensuing soldering operation. Also, it has been found that handling of the panels between the insertion and the soldering operations often creates a problem, inasmuch as care must be taken that a fragile bent-up portion of a thin wire lead adjacent its printed wire terminal not be accidentally pulled away from its terminal prior to solder-bonding thereto.

It is an object of this invention to provide improved means for mounting diminutive electrical components.

It is another object of this invention to provide means enabling insertion of small electrical components by mechanical means in printed wiring panels.

It is still another object of this invention to provide novel means effective to provide rigid attachment of small electric components upon printed wire panels.

In the accomplishment of these objectives, a preferred embodiment of the present invention contemplates provision of a mounting base or socket adapted to receive the metallic base portion of a component such as, for example, the envelope or housing of a semiconductor device having lead wires extending therefrom, said mounting base having grooves adapted to receive the wire leads, the grooves being so configured that insertion of the base and associated component into an aperture provided in a printed wire panel brings the wire leads into adjacency to the desired printed circuitry adapted for soldering of the leads thereto. It is a feature of this invention that sufficient force to hold the component in place prior to and during the soldering operation is derived from the wedging action of the wire leads between the base and the adjacent portions of the wiring panel forming the aperture.

The manner in which the objects and advantages of the invention may best be achieved will be clearly understood from a consideration of the following description taken in conjunction with the accompanying drawing in which.

Figure 1:
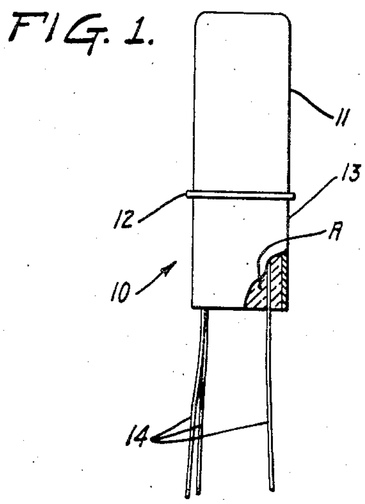
Figure 1 is an elevational view, on a greatly enlarged scale, showing a component adapted for mounting through utilization of apparatus embodying principles of this invention.

Now making more detailed reference to the drawing and more particularly to Figure 1 thereof, there is shown, by way of example, a semiconductor device 10, of known type, adapted for attachment to a printed wire panel by novel mounting means to be hereinafter more fully described. The semiconductor device 10 comprises a cylindrical metallic housing 11 suitably welded along a radially extending flange formed thereon, to a like flange formed in a cylindrical metallic base portion 13, said flanges together forming the built-up flange 12. Extending from electrical apparatus (not shown) contained within the housing 11, through the base portion 13, are lead wires 14, the latter being electrically insulated from the base by suitable insulation A.

Figure 2:
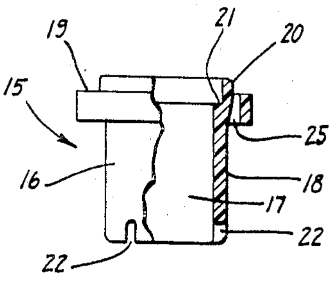
Figure 2 is an elevational view, with parts broken away, showing the mounting means with which this invention is concerned.
Figure 4:
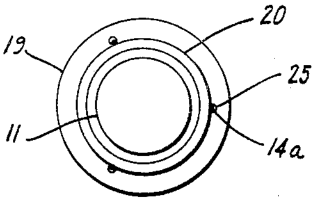
Figure 4 is a plan view of the assembly.

There is shown in Figure 2 the mounting base 15, with which this invention is especially concerned. The base is of electrically non-conductive material, of tubular configuration (Figure 4), and comprises a major body portion 16 provided with an inner cylindrical surface 17 having a diameter slightly greater than that of base portion 13 of the semiconductor device 10.

Figure 3:
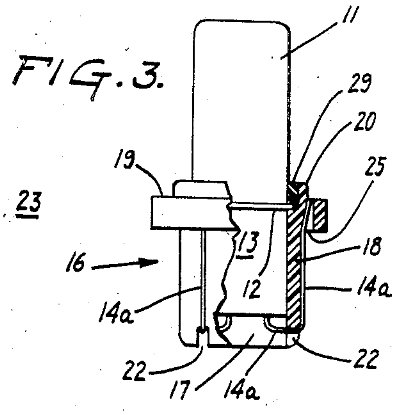
Figure 3 is an elevational showing of a component-mounting base assembly, with parts broken away.
Figure 6:
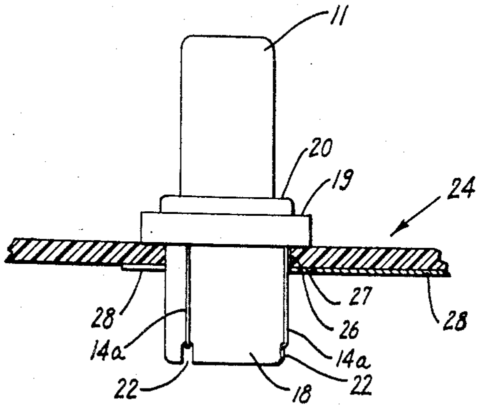
Figure 6 is a cross-sectional view of the panel of Figure 4 and illustrating the assembly shown in Figure 3 inserted therein.
Figure 5:
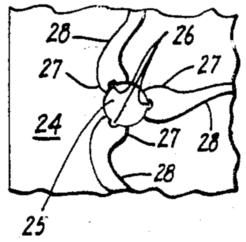
Figure 5 is a fragmentary showing, on a somewhat reduced scale, of a panel adapted to receive the assembly shown in Figure 3.

Disposed along the periphery of the upper portion of the outer surface 18 of the mounting base, and preferably formed integrally with the base, is a radially extending peripheral flange 19. Extending axially upward from flange 19 is sleeve-like section or flange 20, having an inside diameter slightly greater than that of inner surface 17, cooperably disposed with the flange to form the shoulder, or off-set 21. Disposed in the lower end of body portion 16 are radially extending grooves, or notches, 22. Preferably there is a groove for each lead wire 14, as will become more evident upon consideration of Figure 3, wherein there is shown a mounting base-semiconductor housing assembly 23 adapted for insertion into a suitable printed wire panel 24 as shown in Figures 5 and 6. Formed within the flange 19 are openings 25 (see also Figure 4) adapted to receive end portions of bent up lead wires 14*a*.

Formation of the assembly 23 (Figure 3) is accomplished by insertion of base portion 13 of the component, along with wire leads 14, into the upper end of mounting base 15 and into engagement with inner surface 17 a distance sufficient to cause flange 12 to abut the shoulder 21 of the mounting base. Each of the lead wires 14 is then bent outwardly, as shown at 14*a*, into registry with its corresponding slot 22, and thence upwardly along the outer surface 18 of the mounting base. As appears in Figures 3 and 4 the ends of wires 14a are inserted into openings 25. If desired, these wires may extend beyond the flange 19 and may be bent over the latter in order further to ensure rigidity of the wire leads during handling of the same. It will be appreciated that the slots 22 are disposed substantially below the base portion 13 in order to prevent undesirable contact of the bent wire leads 14a with the outer metallic surface of base portion 13.

Suitable means may be provided to anchor the mounting base 15 to the component 10, an example being the provision of a retaining ring 29 of suitable gasket-like material cemented to sleeve-like section 20 to lock the flange 12 against the off-set 21. It is further contemplated that, if desired, anchoring may be effected by forming the sleeve 20 to overlap the flange 12.

The manner in which the elements of the component-mounting base assembly 23 cooperate with the panel 24, following the insertion operation, becomes more apparent from a detailed consideration of Figures 5 and 6. It is pointed out that the mounting base flange 19 not only abuts the upper surface of the panel 24, thereby limiting insertion of the assembly 23, but the flange also presents, to advantage, a rigid, upwardly facing surface upon which the necessary insertion force may be exerted, thereby obviating the need for exerting this force directly upon the component 10, at the risk of causing damage to the latter. Preferably, although not necessarily, the panel includes grooves 26 disposed along edge portions of the aperture 25, the grooves serving to facilitate alignment of circuits through registry of the same with similarly disposed bent wire leads 14a, there being disposed adjacent the grooves 26 terminal portions 27 of printed wires 28 adapted for suitable connection, for example by soldering, to the advantageously presented, substantially rigid, fine wire leads 14a. The resultant complete assembly provides a rigid, unitary combination of a semiconductor, mounting base, and wiring panel wherein possibility of damage to the semiconductor and its leads has been substantially eliminated. There is further ensured the rigidity of elements which it is desired to maintain throughout the ensuing operations, particularly prior to and during the soldering operation, in order that the lead wires may be placed in permanent electrical contact with appropriate circuits.

It is to be understood that, although a preferred embodiment of the invention comprises means for mounting a cylindrically formed housing of conductive material, it is contemplated that various modifications in the shape and nature of the mounting base may be resorted to. For example the lower end of the tubular portion of the base may be substantially closed, having apertures through which the lead wires extend prior to bending and insertion of the latter into the hollow portions or grooves formed in the outer wall structure of the socket. Alternatively, a suitable closure may be formed as a separate element and applied to the lower end of the mounting base. Also the term "printed wiring" should be understood to have a broad connotation, without limitation as respects the method by which the circuitry is applied to the panel. However it will be recognized that the invention contemplates such modifications as fall within the scope of the appended claims.

I claim:

1. In combination with an envelope having a peripheral flange, and a plurality of relatively long thin wire leads extending exteriorly of said envelope, base means comprising: a sleeve of insulating material having a plurality of wire receiving apertures at one end and an aperture at the other end through which the envelope extends, said leads extending outwardly of said sleeve through said wire receiving apertures and being reversely bent and disposed in close adjacency to outer surface portions of said sleeve, said envelope flange abutting said other end of the sleeve; means disposed toward said other end of the sleeve comprising a radially extending flange having a plurality of openings provided therein within which said free end portions of the wire leads are received; and an offset wall portion overlying the peripheral flange of the envelope and retaining the latter within the base means.

2. In combination with an electrical component comprising an envelope provided with flange means extending along peripheral portions thereof, said envelope further having a plurality of lead wires extending therefrom, base means comprising: a sleeve of insulating material having a plurality of apertures at one end and an aperture at the other end within which is received said envelope including said flange means, said sleeve including an inner surface portion closely engaging the received envelope and a ledge portion extending transverse said surface portion and abutting said flange means, and said lead wires extending through said apertures at said one end and along the outer surface of said sleeve; means for retaining said envelope within said base means as well as free end portions of said lead wires, said means being disposed toward said other end of the sleeve and including a flange disposed along the periphery of said sleeve in the region of said aperture and having a plurality of openings within which free end portions of said lead wires are received, said last means further including an annular wall portion extending transversely of said flange and away from said aperture along the axis of said sleeve; and means reacting between said wall portion and said envelope flange means to retain the latter against said ledge portion.

3. In combination with an envelope having a peripheral flange, and a plurality of relatively long thin wire leads extending exteriorly of said envelope, base means comprising: a sleeve of insulating material having wire receiving aperture means at one end and an aperture at the other end within which the envelope extends, said leads extending outwardly of said sleeve through said wire receiving aperture means and being reversely bent and disposed in close adjacency to outer surface portions of said sleeve, said envelope flange abutting said other end of the sleeve; and means disposed toward said other end of the sleeve comprising radially extending flange means arranged to retain free end portions of the wire leads, and axially extending flange means overlying the peripheral flange of the envelope and retaining the latter within the base means.

References Cited in the file of this patent

UNITED STATES PATENTS

| | | |
|---|---|---|
| 714,869 | Cravens | Dec. 2, 1902 |
| 2,033,748 | Wallace | Mar. 10, 1936 |
| 2,053,138 | Donovan | Sept. 1, 1936 |
| 2,611,040 | Brunetti | Sept. 16, 1952 |
| 2,790,961 | Del Camp | Apr. 30, 1957 |

FOREIGN PATENTS

| | | |
|---|---|---|
| 247,937 | Great Britain | Nov. 18, 1926 |